United States Patent [19]
Gott et al.

[11] 3,984,757
[45] Oct. 5, 1976

[54] PROXIMITY ACTUATED POWER CONTROL VARIABLE AS TO SENSE AND MAGNITUDE

[76] Inventors: Daniel A. Gott, 502 N. 3rd Ave., Villa Park, Ill. 60181; J. Marshall Dudley, 924 E. Old Willow Road, Wheeling, Ill. 60090

[22] Filed: June 10, 1974

[21] Appl. No.: 477,913

Related U.S. Application Data

[63] Continuation-in-part of Ser. No. 321,297, Jan. 5, 1973, abandoned.

[52] U.S. Cl. ............................. 323/19; 315/246; 315/268; 317/DIG. 2; 323/24; 323/75 F
[51] Int. Cl.² ...................................... H05B 41/392
[58] Field of Search ........ 307/252 B, 252 N, 252 T, 307/296, 297, 308, 321; 315/200 R, 200 A, 208, 209 R, 246, 268, 272–275, 307; 317/7, 8, 48, DIG. 2; 321/16, 18; 323/19, 22 T, 22 SC, 24, 75 F; 328/5; 340/258 R, 258 B, 365 C

[56] References Cited
UNITED STATES PATENTS

| | | | |
|---|---|---|---|
| 3,132,287 | 5/1964 | Yarbrough | 307/252 T |
| 3,249,805 | 5/1966 | McCabe | 307/252 T |
| 3,353,078 | 11/1967 | Maynard | 323/24 UX |
| 3,456,165 | 7/1969 | Hesselgren | 323/75 F |
| 3,492,440 | 1/1970 | Cerbone et al. | 340/365 C |
| 3,517,261 | 6/1970 | Karp | 315/200 A |
| 3,535,613 | 10/1970 | Katzenstein | 321/16 UX |
| 3,641,410 | 2/1972 | Vogelsberg | 340/365 C |
| 3,668,698 | 6/1972 | Demirdjioghlou et al. | 340/365 C |
| 3,691,298 | 9/1972 | Pittman et al. | 323/22 T |
| 3,714,546 | 1/1973 | Tolworthy et al. | 323/24 X |
| 3,736,445 | 5/1973 | Sickle | 307/308 |
| 3,740,744 | 6/1973 | Nakada et al. | 340/365 C |

OTHER PUBLICATIONS

Nick, Touch Sensitive Circuits, IBM Technical Disclosure Bulletin, vol. 6 No. 4, Sept. 1963, pp. 135,136.

*Primary Examiner*—A. D. Pellinen
*Attorney, Agent, or Firm*—Darbo, Robertson & Vandenburgh

[57] ABSTRACT

When connected to an ordinary A.C. power source, the apparatus has a power supply in which a circuit ground oscillates in voltage with respect to the earth ground, no matter with which polarity the apparatus is connected to the power source. A person's capacitative coupling to earth ground is employed to create a circuit in one or the other of two sensing heads (depending upon which the person approaches) to use that pulsating voltage to charge a capacitor in the respective sensing head. From one head the capacitor charge is applied to a memory in the sense to increase a potential stored in the memory while from the other head the charge is applied in the sense of decreasing the potential. The potential in the memory is employed as one component of the total voltage required to initiate the firing of a triac, whereby the phase angle of the firing will be determined by the magnitude of the stored potential.

46 Claims, 5 Drawing Figures

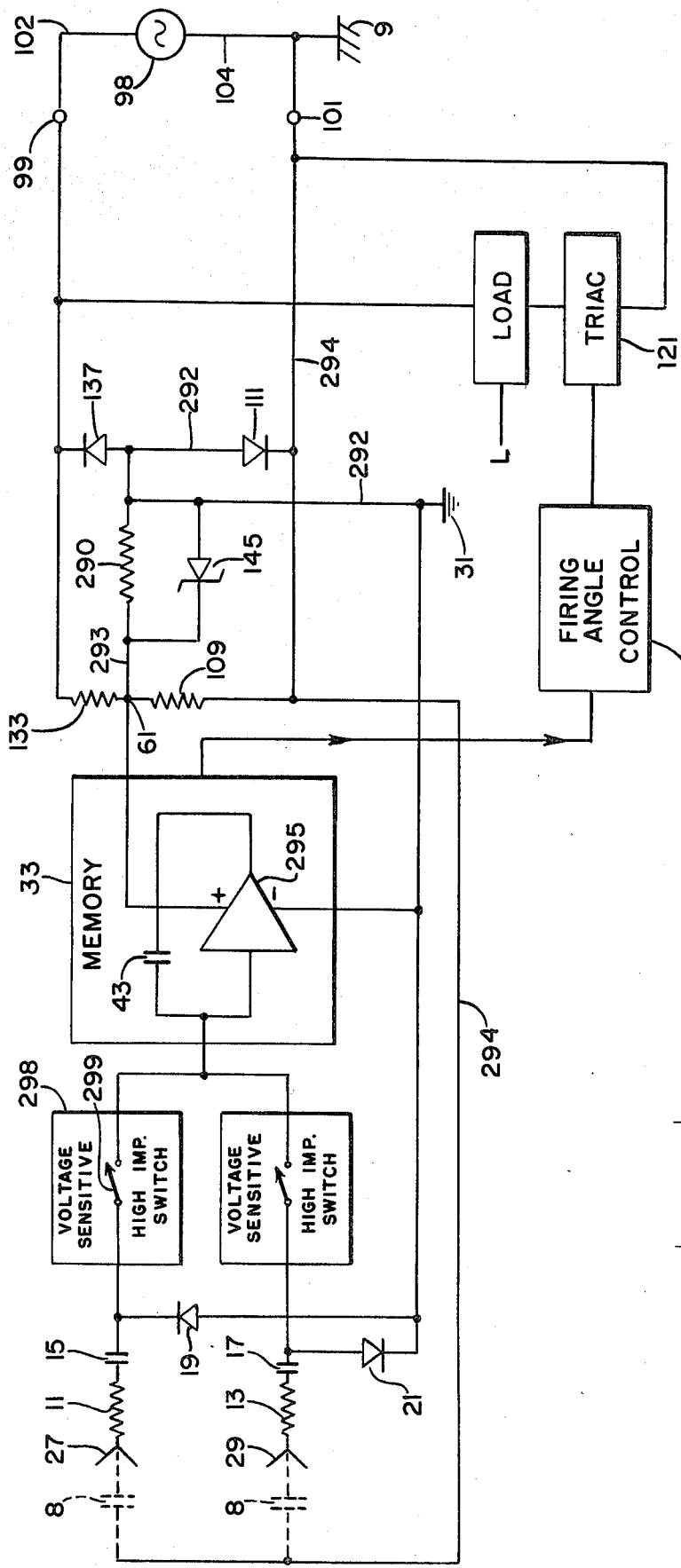

PROXIMITY ACTUATED POWER CONTROL VARIABLE AS TO SENSE AND MAGNITUDE

RELATED APPLICATION

This application is a continuation-in-part of the application of David C. King, Jr., Daniel A. Gott and J. Marshall Dudley for ELECTRONIC POWER CONTROL, Ser. No. 321,297, filed Jan. 5, 1973, now abandoned and the "Embodiment Disclosed In The Parent Application" herein is entitled to the filing date of said prior application. The disclosure of said parent application is incorporated herein by reference.

BACKGROUND AND SUMMARY OF THE INVENTION

Various forms of controls for the power supply to an A.C. load are known which controls will increase or reduce the power to the load. Thus, for example, a rheostat connected in series with an electric light bulb can be adjusted to increase or decrease the power at the light bulb and thereby change the degree of illumination therefrom. A silicon controlled rectifier (SCR) or a triac is connected in series with a load, with a firing angle control being connected to the SCR, to adjust the amount of each alternating current pulse received by the load and thus control the amount of A.C. power that the load receives. In the main, such prior art devices require a manual manipulation in order to achieve the desired result.

Proximity controls are known wherein a person's resistance or capacitance is applied to an electronic circuit to produce an output signal, which output signal is then used to effect a desired result. In the main, the output signals of proximity detectors have been merely on-off signals, as distinguished from a proportional control wherein the signal has a magnitude which is a function of the length of time that the person's capacitance or resistance is applied to the detector. However, U.S. Pat. No. 3,736,445 discloses a proximity detector which operates an SCR to adjust the power to a load in accordance with the length of time that a person's body is present to effect an electrical coupling in the proximity detector circuit; that is, it is a proportional control operated by a proximity detector. The device of this patent employs an oscillator component which is connected to a touch plate and two sensors connected to respective touch plates. When a person contacts the oscillator touch plate and one of the sensor touch plates his body completes a circuit between the oscillator and the respective sensor (much as would the connection of a wire or the closing of a switch therebetween) so as to actuate the sensor. As compared to such a prior art device, the present invention greatly simplifies the proximity control by reason of the fact that it does not employ an oscillator component (as that term is conventionally used). Instead, it employs the standard alternating current source, used to power the unit, as the oscillator. The elimination of the oscillator component significantly reduces the cost of the apparatus and also reduces the overall apparatus size. This broadens the range of application of such a control. Thereby, for example, it can be embodied in an ordinary house light or lamp or it can be mounted in a switchbox. Furthermore, it is not necessary that two touch plates or the like be employed which must be contacted simultaneously in order to connect the oscillator to the sensor. A single touch plate for each sensor is all that need be contacted by the individual in order to actuate the control in a given sense of change.

Like the proportional control referred to, the present invention employs a capacitor connected in parallel with an amplifier as a memory in order to maintain an established operational level when a person's body is not being sensed. However, in the present invention the resistance in the capacitor circuit is very high, i.e., at least ten million megohms, so as to prevent any significant leakage of the charge on the capacitor. Thus, with embodiments of the present invention, the unit can be unplugged from the A.C. power source for a period of even days and when it is plugged back in, the power supply to the load will correspond to the level established at the time the unit was unplugged because the charge on the memory capacitor is substantially unchanged.

A further important distinction of the present invention lies in the simplicity of a sensor. Each of the two sensors is a unipolar current pump. Essentially each comprises nothing more than a diode and a voltage sensitive switch. The diode of one sensor is arranged so that current is pumped only in one direction with respect to the memory capacitor and the diode of the other sensor permits current to be pumped only in the opposite direction when a person's capacitance is applied to the sensor. Each diode is connected to the memory capacitor by a respective voltage sensitive switch. While various forms of voltage sensitive switches could be utilized, a neon bulb represents the ultimate in simplicity. It has the further advantage that is presents a high resistance against leakage of a charge on the memory capacitor when it is in the dormant state. When the current pump of one sensor is activated by a person's capacitance being applied thereacross, a voltage is reached which is sufficiently high to cause the neon bulb to fire resulting in current being applied across the memory capacitor to add to, or substract from, as the case may be, the charge on the memory capacitor. This occurs during a portion of each cycle and as soon as the voltage across the neon bulb drops below the level required to maintain conduction in the neon bulb, the current flow ceases. The number of cycles during which such pumping action occurs is determined by the length of time that a person's capacitance is applied to the sensor.

Another feature of the present invention is the floating ground reference of the apparatus, as distinguished from the earth ground (which is the ground to which one of the power supply wires is connected). This permits, for example, the apparatus to be plugged into a wall socket in either orientation of the plug with respect to the socket, without changing the manner in which the apparatus operates. The apparatus disclosed in U.S. Pat. No. 3,641,410 includes a current pump which operates through a neon bulb as a switch. However, with that apparatus, it is necessary, in order not to change the function of the apparatus, to have the plug inserted into the wall socket with a predetermined orientation. With a proximity control such as might be used on a table lamp, for example, it is undesirable to require that the plug be inserted into the socket in a particular orientation in order to maintain the proper ground connection. Many users of table lamps have outlets which are not polarized and therefore such a requirement would limit the saleability of the lamp. Furthermore, a possibility that the outlet has been incorrectly connected always exists and an incorrect connection could change the orientation with respect to earth ground.

Another feature of the invention is that a limit control is incorporated to establish the maximum charge that may be placed upon the memory capacitor. Without such a control, it is possible for the charge on the memory capacitor to be increased substantially beyond the range within which the power applied to the load is at a maximum. When this occurs, there is a substantial lag in diminishing the power supply to the load because, before any change in the power to the load can be effected, the voltage on the memory capacitor must be brought back within the operating range. The time lag thereby occasioned is eliminated by the limit control on the maximum charge of the memory capacitor. In the disclosed embodiment of this limit control, it incorporates a transistor which also doubles as the diode for the increase current pump.

DESCRIPTION OF THE DRAWINGS

FIG. 3 is a simplified diagrammatic representation of the embodiment of FIG. 1;

FIG. 4A is a representation of a cycle of the A.C. wave of the A.C. power supply; and FIG. 4B is a representation of the oscillation of circuit ground to earth ground as related to the A.C. wave of FIG. 4A using the embodiment of FIGS. 1 and 3.

DESCRIPTION OF SPECIFIC EMBODIMENTS

Embodiment Disclosed In The Parent Application

Figure 1:
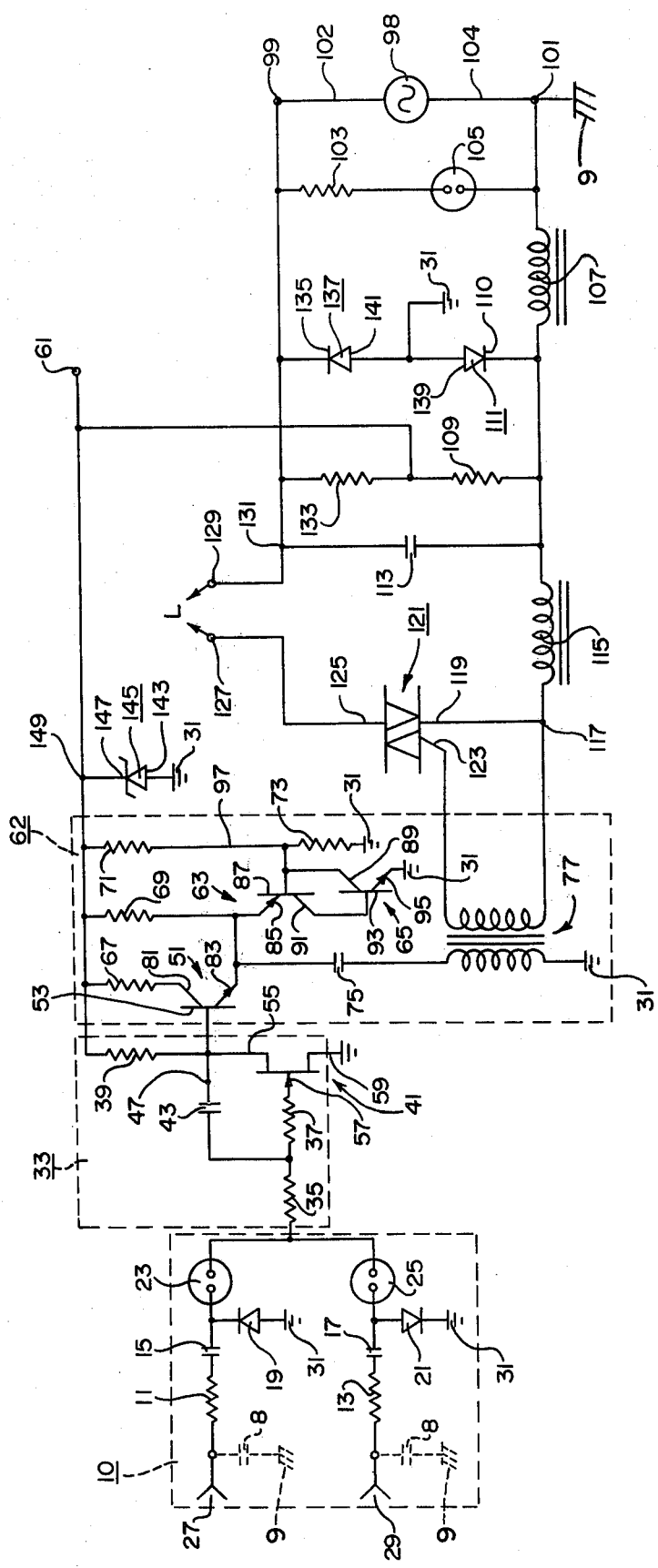
FIG. 1 is a schematic illustration of an embodiment and constitutes the Embodiment Disclosed In The Parent Application.

The left side of the drawing clearly shows the schematic symbol for touch capacitance detection 8 i.e. body capacitance to natural or earth ground 9, the input coupling or detector section 10 includes a pair of resistors 11, 13; a pair of capacitors 15, 17; a pair of diodes 19, 21; a pair of neon bulbs 23, 25; a decrease input terminal or sensor 27; and an increase input terminal 29. The decrease input terminal 27 connects to one end of current limiting resistor 11. the other end of resistor 11 is coupled through capacitor 15 to the junction of the cathode of pumping diode 19 and one terminal of neon bulb 23. The anode of diode 19 is connected to circuit ground 31, this being sometimes referred to herein as ground reference since its potential varies with respect to A.C. or earth ground. The increase input terminal or sensor 29 connects to one end of current limiting resistor 13. The other end of resistor 13 is coupled through capacitor 17 to the junction of the anode of pumping diode 21 and one terminal of neon bulb 25. The cathode of diode 21 is connected to circuit ground 31.

An analog memory section 33 is included having three resistors 35, 37, 39 and a field effect transistor 41. One end of current limiting resistor 35 is connected to the junction of neon bulbs 23, 25 and defines the input of the memory section as well as the output of the detector section. The other end of resistor 35 connects to the junction of current limiting resistor 37 and the negative end of an analog memory integrating capacitor 43, also shown as part of the analog memory section or circuit 33. The junction of resistors 35, 37 and capacitor 43 form the summing junction to the input of a Miller integrator. The positive terminal 47 of capacitor 43 is connected to the junction of the drain current biasing resistor 39, base terminal 53 of transistor 51, and the drain terminal 55 of field effect transistor 41. The other end of resistor 37 connects to the gate terminal 57 of transistor 41. The source terminal 59 of transistor 41 connects to circuit ground 31. The other end of resistor 39, connects to the V + voltage supply terminal shown at 61.

The voltage/time (firing angle) converter section 62 includes the previously mentioned transistor 51; a pair of transistors 63, 65; four resistors 67, 69, 71, 73; a capacitor 75; and a transformer 77. The base terminal 53 of the initial condition buffer transistor 51 connects to the output of the analog memory section drain terminal 55 of the transistor 41. The collector terminal 81 of transistor 51 is connected to V + 61 through current limiting resistor 67. the emitter terminal 83 of transistor 51 connects to the timing junction capacitor 75, resistor 69, and the emitter terminal 85 of transistor 63. The other end of resistor 69 connects to V + terminal 61. The remaining side of capacitor 75 connects to circuit ground 31 through the primary of transformer 77. A path is thus established through resistor 69 to charge capacitor 75. Pseudothyristor transistors 63 and 65 are connected in the following manner: The emitter 85 of transistor 63 connects to the junction of the emitter terminal 83 of transistor 51, one end of capacitor 75, and resistor 69. The base terminal 87 of transistor 63 connects to the junction of the collector terminal 89 of transistor 65 and one end of resistors 71 and 73. Also, the collector terminal 91 of transistor 63 connects to the base terminal 93 of transistor 65. Finally, the emitter terminal 95 of transistor 65 connects to circuit ground 31. This configuration makes the pair of transistors 63 and 65 behave as a programmable unijunction transistor (PUT), that is, the anode, gate and cathode of a PUT respectively correspond to the emitter terminal 85 of transistor 63; the junction of the base terminal 87 of transistor 63 and collector terminal 89 of transistor 65; and the emitter 95 of transistor 65. The other side of resistor 71 is attached to V + terminal 61 and the other side of 73 is attached to circuit ground 31, thereby forming a voltage divider which establishes a reference voltage on the line shown at 97. A typical A.C. voltage source, shown as alternator 98, is connected between load terminals 99, 101 by a pair of power lines 102, 104 irrespective of ground (although, as is conventional, one of the power lines 102, 104 will be grounded). One end of a resistor 103 is connected to terminal 99. The other end of resistor 103 is connected to one end of neon bulb 105. The remaining side of neon bulb 105 connects to terminal 101. Neon 105 acts as a power on indicator since it is connected in series with resistor 103 and across the A.C. input terminals 99 and 101. One end of radio frequency inductor 107 connects to the junction of neon bulb 105 and the A.C. input terminal 101. The other end of inductor 107 connects to the junction of current limiting resistor 109; cathode 110 of oscillating ground reference diode 111, one end of RFI suppression capacitor 113 and one end of RFI reduction choke coil 115. The remaining end of RFI inductor 115 connects to the junction 117 of terminal 119 of triac 121, and one end of the secondary winding of transformer 77. The remaining end of the secondary of transformer 77 connects to the gate terminal 123 of triac 121. Terminal 125 of triac 121 connects to load terminal 127. The remaining load terminal 129 connects to the junction 131 of the current limiting resistor 133, cathode 135 of oscillating ground reference diode 137, one end of resistor 103, A.C. input terminal 99, and the remaining end of capacitor 113. The respective anodes 139, 141 of diodes 111 and 137 connect to circuit ground 31. The anode 143 of zener diode 145 also connects to circuit ground 31. The cathode 147 of zener diode 145 connects to the junction 149 of resistors 39, 67, 69, 71, 109, and 133. Zener diode 145 establishes magnitude of the V + voltage at terminal 61 through resistors 109, 133 back to the A.C. input terminals 99/101 irrespective of A.C. line (or earth) ground. In actual practice terminal 61 does not exist as such but it has been shown for convenience of description.

OPERATION OF EMBODIMENT OF FIG. 1

When triac 121 is conducting, current is applied to the load L (e.g. a light bulb, a motor, etc.) through the series path from A.C. input terminal 99, load terminals 129, 127 through the triac 121, inductors 115, 107 to line terminal 101.

Conventionally, one of the power lines 102 or 104 will be grounded to the normal A.C. or earth ground 9. In the drawing power line 104 is illustrated as being grounded. Thus, the voltage at terminal 99 oscillates (60 hertz in the U.S.) above and below earth ground. As the voltage at terminal 99 goes above earth ground, the potential at terminal 61 becomes positive with respect to circuit ground 31 (through the connection provided by current limiting resistor 133) and diode 111 conducts, whereby the potential at circuit ground 31 corresponds to that of earth ground 9. Diode 137 blocks. As the voltage at terminal 99 goes below earth ground, the potential at terminal 61 becomes positive with respect to circuit ground 31 (through the connection provided by current limiting resistor 109) and diode 137 conducts, whereby the potential at circuit ground 31 drops (in a half Sine wave) below that of earth ground 9. Diode 111 blocks. Should the apparatus be plugged into a wall socket, for example, with the opposite polarity from that shown, so that terminal 99 now represents earth ground and terminal 101 the ungrounded terminal, the end result will be the same; namely, that within the period of each full cycle, terminal 61 goes positive (with respect to circuit ground) during each of the half cycles, and circuit ground 31 goes negative (with respect to earth ground) during one of the half cycles while remaining at earth ground potential during the other of the half cycles.

Referring now to a general discussion of the electronic power control of the present invention and the operation thereof, the input coupling network is primarily composed of capacitors 15 and 17 and neon bulbs 23 and 25 and resistors 11 and 13. The doides 19 and 21 are connected to an oscillating ground reference, 31 which, in conjunction with capacitors 15 and 17 form a voltage doubler (current pump) whenever the input is terminated to a non-oscillating reference i.e. operator's body capacity to ground. This voltage doubler (current pump) causes a small amount of charge to flow through the respective neon bulbs 23, 25 into the analog memory circuit 33 during each cycle.

For example, if a person touches increase input terminal 29, a capacitance 8 to earth ground 9 is connected to resistor 13. During a half cycle when circuit ground 31 goes negative with respect to earth ground 9, capacitor 17 becomes positively charged to the peak line votage. During the next half cycle the circuit ground 31 has a potential corresponding to earth ground; thus, the charge on capacitor 17 is applied across the neon bulb 25 and since it exceeds the breakdown voltage of the neon bulb a current flows from capacitor 17 through the neon bulb 25 and resistor 35 to the input of the Miller integrator 37, 41, 43. This current flows through the capacitor 43 of the integrator and reverse biases the gate 57 thereby decreasing the current flow through the drain current biasing resistor 39. This causes the potential at drain terminal 55 to rise so that the potential on analog memory integrating capacitor 43 increases its potential accordingly, i.e., changes the stored signal in one direction or sense. The capacitor potential maintains the bias of the transistor so that the current flow through the transistor (and thus resistor 39) maintains the thus established potential of terminal 55. This process repeats each cycle so that the longer a person holds his finger on terminal 29, the greater will be the increase in potential across capacitor 43. Obviously, the magnitude of capacitance provided by a person, as represented by capacitor 8, will also affect the rate at which the charge on memory capacitor 43 increases. In a corresponding manner, when terminal 27 is touched and the circuit ground 31 goes negative with respect to earth ground 9, neon bulb 23 conducts to place a positive charge on capacitor 15 (corresponding to the peak line voltage) and the removal of this charge acts to reduce the potential on analog memory integrating capacitor 43, i.e., changes the stored signal in the other direction or sense.

Although neon bulbs 23, 25 are used in this particular application as the high impedance current switches; zeners, 4 layer diodes, transistors, FETS, thyristers or any other well known electronic switching device may be used without departing from the spirit and scope of this invention. Resistors 11, 13 limit the current flowing through the input terminal to a level below that which would present a shock hazard to the operator.

The analog memory circuit 33 is composed of resistors 35, 37, 39, capacitor 43, and transistor 41. Resistors 35, 37 are used to protect the transistor 41 from static discharges on the inputs. Capacitor 43, resistor 39, and transistor 41 collectively form a conventional integrator whose output is fed to transistor 51 as a control voltage for the voltage to time converter discussed previously. For example, at the start of a cycle the initial condition buffer transistor 51 applies the potential then appearing at the output terminal 47, 55 of the analog memory section 33 to capacitor 75. Assume for the sake of discussion that this was three volts and that the voltage required to fire PUT 63, 65 is six volts, capacitor 75 requires an additional three volts of charge to so act. This additional charge builds up over a period of time by reason of the current flow through resistor 69. If the initial charge, i.e. that coming from the memory, is relatively small it takes longer for the total charge to accumulate in capacitor 75 and, conversely, the time to full charge is decreased if the initial charge is increased. When the PUT 63, 65 fires, capacitor 75 discharges creating a current flow through the primary of transformer 77. The resultant pulse in the transformer secondary casues triac 121 to fire. Thus the firing angle of the triac is determined by the voltage signal (the charge stored on capacitor 43) stored in the analog memory section 33 (all other factors being equal). The integrator is arranged such that the charge on capacitor 43 is not lost during the transition through zero crossing or upon removal of power. The FET transistor 41 can be any well known type of voltage, current, charge or mechanical sensing device, such as a Transistor, Vacuum Tube, MOSFET, Varicap, or Operational Amplifier. The capacitor 43 can be replaced by any well known type of energy storage device, including electrostatic, chemical, magentic or mechanical types. If a MOSFET is used, capacitor 43 can be connected between the gate 57 and oscillating ground reference 31 without loss of charge.

The pulse transofrmer 77 is used to fire the triac 121 to act as a power switch. The pulse transformer 77 may be eliminated by substituting an SCR and a full wave bridge, (not shown) to switch power to the Load L. Depending on the device selected to switch power to the Load L, an appropriate output coupling device well known to those having ordinary skill in the art should be used to replace the transformer 77.

The oscillating ground reference 31 is derived by using the two diodes 111, 137 either of which will conduct depending on the polarity of the power line during any half cycle. Since diodes 111, 137 derive their ground reference from both sides of the power line, the oscillating ground reference 31 will be independent of the polarity of the power line, and a negative going transition will occur for every full cycle.

Also, diodes 111, 137 together with resistors 109, 133, and zener voltage of diode 145 form a non-filtered regulated supply which is clipped at the zener voltage of diode 145 and falls to zero voltage each time the power line voltage crosses zero.

Although the invention is described and illustrated with respect to a preferred embodiment thereof, it is to be understood that it is not to be so limited since changes and modifications may be made therein which are within the full intended scope of the invention.

DESCRIPTION OF ADDED EMBODIMENT

Figure 2:
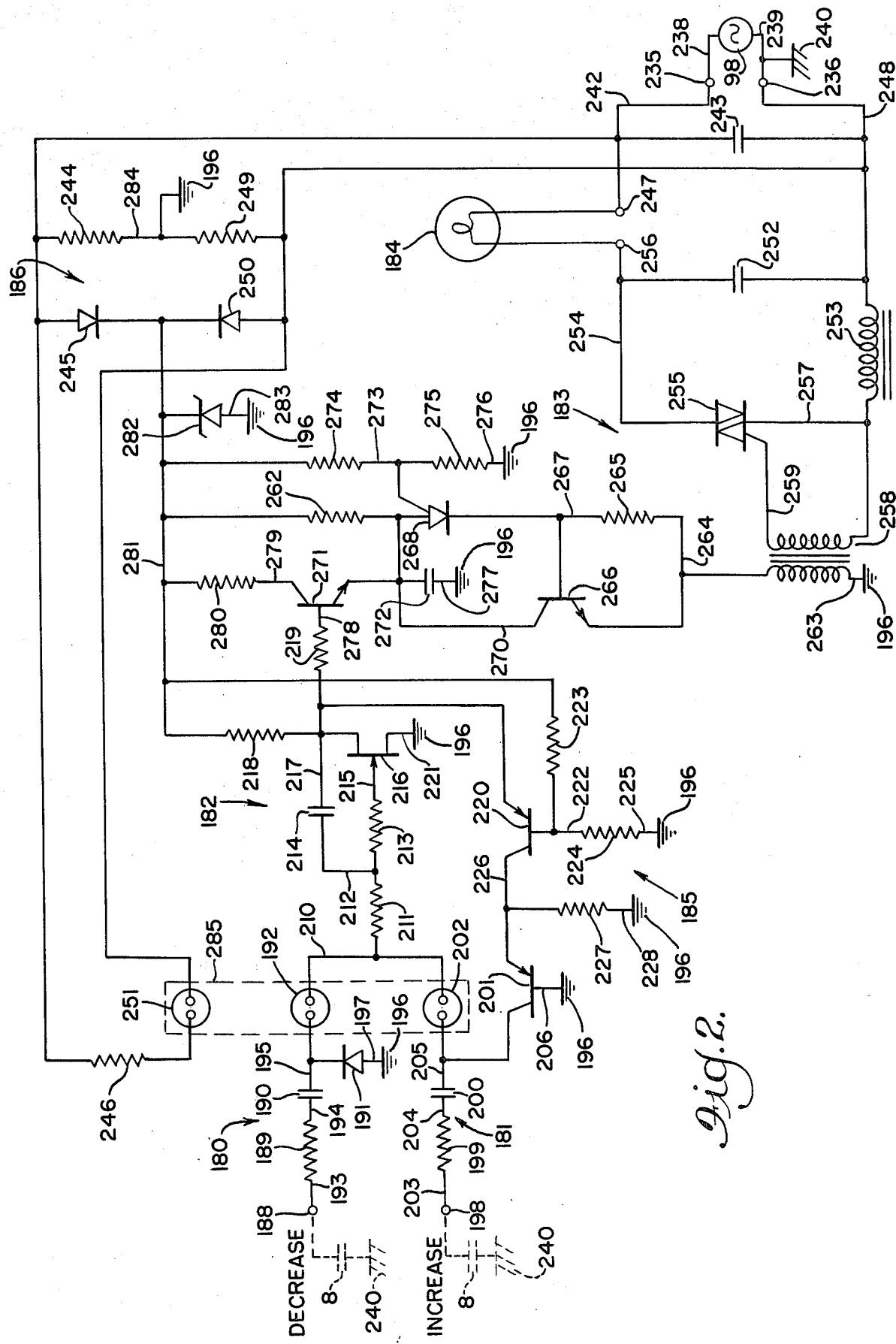
FIG. 2 is a schematic illustration of an alternative embodiment.

The embodiment illustrated in FIG. 2 comprises two sensors generally 180 and 181, an analog memory generally 182, a power control generally 183 for a load generally 184, a limit control generally 185 which also doubles as the diode of sensor 181, and a floating ground reference, generally 186.

The decrease sensor 180 comprises an input terminal or touch plate 188 to which is connected a detector comprising a resistor 189, a capacitor 190 and a diode 191. A neon bulb 192 forms a voltage sensitive, high impedance switch. A wire 193 connects terminal 188 to resistor 189; a wire 194 connects resistor 189 to capacitor 190; and a wire 195 connects capacitor 190, the cathode of diode 191 and neon bulb 192. The anode of diode 191 is connected to circuit ground (or ground reference) 196 by a wire 197. An input terminal or touch plate 198 forms the increase sensor 181. The related detector includes a resistor 199, a capacitor 200 and a transistor 201 (which normally functions as a diode). Neon bulb 202 acts as the voltage sensitive, high impedance switch. A wire 203 connects terminal 198 and resistor 199; a wire 204 connects resistor 199 and capacitor 200; and a wire 205 connects capacitor 200, the collector of transistor 201 and neon bulb 202. A wire 206 connects the base of transistor 201 to circuit ground 196.

A wire 210 connects neon bulbs 192 and 202 to a current limiting resistor 211. A wire 212 connects current limiting resistors 211 and 213 with a memory capacitor 214. A wire 215 connects resistors 213 to the gate of a field effect transistor (FET) 216. A wire 217 connects capacitor 214, drain current biasing resistor 218, an isolation resistor 219, the drain of transistor 216 and the emitter of a transistor 220. The source of FET 216 is connected to circuit ground by a wire 221. The base of transistor 220 is connected by a wire 222 to biasing resistors 223 and 224. A wire 225 connects resistor 224 to circuit ground. The collector of transistor 220 is connected by a wire 226 to a leakage dissipating resistor 227 and the emitter of transistor 201. A wire 228 connects resistor 227 to circuit ground.

The A.C. power input connections or terminals which, for example, could be a plug which is inserted into a wall socket, are represented by connections 235 and 236. The source of A.C. power is represented by 98 and the A.C. power lines 238 and 239 transmit the A.C. power to connections 235 and 236. As is conventional, one of these power lines is connected to earth ground. In FIG. 2 it is power line 239 that is connected to earth ground 240. However, as is described elsewhere herein, it could be either of the power lines and the apparatus will operate without having a particular polarity of the input connections 235 and 236 to the power lines, e.g. the plug need not be inserted in the wall socket in a particular orientation to make the apparatus function properly.

From A.C. power input connection 235 a wire 242 leads to radio frequency interference suppressor capacitor 243, a resistor 244, the anode of a diode 245, a limiting resistor 246, and a load connection 247. A wire 248 from A.C. connection 236 leads to capacitor 243, a resistor 249, the anode of diode 250, a neon bulb 251, a radio frequency interference suppressor capacitor 252, and a radio frequency suppression inductor 253. A wire 254 connects capacitor 252 with one of the main electrodes of a traic 255 and with load connection 256. A wire 257 connects the other main electrode of the triac with inductor 253 and one side of the secondary of a trigger transformer 258. The other side of the transformer secondary is connecteds to the gate of the traic 255 by a wire 259.

One end of the primary of firing transformer 258 is connected to circuit ground 196 by a wire 263, and the other end is connected by a wire 264 to a resistor 265 and the emitter of a transistor 266. A wire 267 connects resistor 265 with the base of transistor 266 and the cathode of a programmable unijunction transistor (PUT) 268. A wire 270 connects the collector of transistor 266 with the emitter of a transistor 271, a capacitor 272, the anode of PUT 268 and a resistor 262. The gate of PUT 268 is connected by a wire 273 to a voltage divider comprising resistors 274 and 275. Resistor 275 and capacitor 272 are respectively connected by wires 276 and 277 to circuit ground 196. A wire 278 connects the base of transistor 271 to resistor 219. A wire 279 connects the collector of transistor 271 to a current limiting resistor 280. A wire 281 connects resistors 218, 223, 280, 262, and 274 with a zener diode 282 and the cathodes of diodes 245 and 250. A wire 283 connects the anode of zener diode 282 with circuit ground 196. A wire 284 connects resistors 244 and 249 to circuit ground 196.

The neon bulbs 192, 202 and 251 are all enclosed in a short length of black, shrink plastic tubing. This tubing is shrunk about the bulbs and the ends are heat sealed. This tube prevents the ambient light from reaching the neon bulbs. Neon bulb 251 is on at all times and acts as a primer light source to ensure that bulbs 192 and 202 fire reliably when the respective sensor is activated by the capacitance of a person's body being applied thereto.

As an example of the actual components of an embodiment, the following circuit values are employed: resistors 189 and 199 are each 1 megohm; capacitors 190 and 200 are 150 picofarads; diode 191 is a 1N459; neon bulbs 192 and 202 are each an NE2; neon bulb 251 is an NE23; resistor 246 is 240 K ohms; resistors 211 and 213 are 120 K ohms and 22 megohms; capacitor 214 is 0.22 microfarads; transistor 216 is a 2N4119; resistors 218 and 219 are each 120 K ohms; transistor 201 is a 2N4888; and transistor 220 is a 2N3905; resistors 223, 224 and 227 are respectively 180 K ohms and 120 K ohms; transistors 266 and 271 are respectively a 2N3904 and a 2N3903; capacitor 272 is 0.1 microfarads, ceramic; PUT 268 is a 2N6027; resistors 265 and 262 are 120 K ohms; resistors 274 and 275 are each 240 K ohms; diode 282 is a 1N963A, 12 volt; diodes 245 and 250 are each a 1N4004; resistors 244 and 249 are 22 K ohms, ½ watt; triac 255 is an SC141B; inductor 253 is 100 microhenrys; transformer 258 is a 1 to 1 transformer; capacitors 252 and 243 are each 0.02 microfarads.

OPERATION OF THE EMBODIMENT OF FIG. 2

With the apparatus suitably connected to a 110 volt power source 98, as illustrated, the circuit ground 196 oscillates with respect to the power supply wires 242 and 248. Actually, we prefer the arrangement of the oscillating circuit ground as illustrated in FIG. 1, but the alternative illustrated in FIG. 2 will be satisfactory. In the FIG. 2 embodiment, during successive half cycles the current will flow successively from A.C. wires 242 and 248 through diodes 245 and 250 to reach wire 281 and will return from circuit ground 196 successively through resistors 249 and 244. As compared to earth ground 240 the potential of circuit ground will pulsate between something in the neighborhood of 150 volts positive to about 12 volts negative.

In steady state operation, there is an unvarying charge on memory capacitor 214. This charge controls the bias of FET 216 so that with each positive pulse at wire 281 (as compared to circuit ground 196) the maximum voltage developed at wire 217 is thereby determined. Through resistor 219 and transistor 271 this voltage is applied to capacitor 272 rather promptly during the initial portion of each positive pulse. At a comparatively slower rate during the initial portion of each positive pulse, capacitor 272 also is charged through resistor 262. When the total charge on capacitor 272 reaches the firing voltage of PUT 268 (which firing voltage is preprogrammed by the voltage at 273 determined by voltage divider 274, 275) the PUT fires. This in turn turns on transistor 266. The charge on capacitor 272 then flows to circuit ground through the primary of transformer 258, most of the current flow being through transistor 266. The charge on capacitor 214 thus determines the initial voltage applied to firing capacitor 272 which, in turn, determines the time required for current flow through resistor 262 to complete the voltage charge on capacitor 272 necessary to fire PUT 268. Thus the time during the A.C. pulse (i.e. the phase angle) at which the triac 255 is turned on to produce a circuit through the load 184 from the A.C. input connections 235 and 236 is determined.

Assuming that a person wishes to decrease the power supplied to load 184, he would touch the decrease contact 188 of sensor 180. This would cause a capacitance 8 to be connected between contact 188 and earth ground 240, as illustrated in dashed lines. The person need not actually touch anything more than contanct 188. If the person were actually touching earth ground 240 (e.g. a water pipe) at the same time that he was touching contact 188, the rate of change would be somewhat greater, but this would be the only effect. Resistor 189 is used as protection against too great a rate of change in that event and protects the person against shock hazard. The resistor also eliminates the effect of a static electrical charge that may be present in a person's body, such as may occur from walking across a rug during cold weather.

As the first half of a positive pulse of circuit ground with respect to earth ground occurs, the diode 191 conducts so as to permit a current flow from circuit ground through capacitor 190, resistor 189 and capacitor 8 to earth ground, thus charging capacitors 8 and 190. However, during the second half of that pulse, circuit ground 196 is going negative with respect to earth ground and diode 191 is blocking any reverse flow through the same path. Thus the charge built up on capacitor 190 causes the breakdown of neon bulb 192, and the neon commences conducting (i.e. acts like the closing of a switch) so that the charge on capacitor 190 is neutralized by charge from memory capacitor 214. When the voltage across neon bulb 192 decreases to the level at which conduction no longer can be sustained, it turns off (i.e. the switch opens). However, when the next corresponding A.C. half cycle occurs the process is repeated and move current is pumped into memory capacitor 214 decreasing the charge on that capacitor. This is repeated so long as the person's capacitance 8 continues to be applied to touch plate 188. Thus, the longer a person holds his finger on touch plate 188, the less will be the total magnitude of the charge on memory capacitor 214. Corresponding to the change in the charge on memory capacitor 214, there is a change in the initial voltage applied to the anode of PUT 268. This changes the firing angle of triac 255 so as to decrease the portion of the half-wave cycle during which the triac switches on for the application of power to load 184.

In a corresponding manner, the charge on capacitor 214 is increased when a person touches input terminal 198 so as to apply the capacitance 8 between that terminal and earth ground 240, as illustrated in dashed lines in FIG. 2. During the first half of a positive pulse of circuit ground with respect to earth ground, transistor 201 (the collector to base acting as a diode) is blocking. When the voltage of circuit ground 196 reaches the breakdown voltage of enon bulb 202, the bulb conducts and current flows from memory capacitor 214 to add to the charge already existing thereon. Neon bulb turns off when the voltage thereacross is insufficient to sustain conduction. During the second half of the positive pulse, transistor 201 (acting as a diode) conducts neutralizing the charge which accumulated on capacitors 8 and 200 during the previous half cycle. This action of pumping current out of memory capacitor 214 to increase the charge thereon is repeated during the first half of each positive pulse so long as a person holds their finger on terminal 198 and thus the magnitude of the charge existing in the memory capacitor is determined by the length of the time period that such action is taken. With the start of an A.C. half cycle the voltage immediately applied to capacitor 272 from the memory will be comparatively higher so that PUT 268 will fire earlier in the half cycle and thus there will be more of the half cycle (more power) applied to load 184.

If a person were to hold his finger on input terminal 198 beyond the point at which the charge on capacitor 214 was sufficient to apply maximum power to load 184, he would still act to increase the charge on memory capacitor 214. Assuming that the charge on memory capacitor 214 was thus increased substantially above the magnitude at which it had any effect upon the change in power to load 184, that excess charge on memory capacitor 214 would have to be eliminated before any decrease in the memory capacitor charge had any effect upon the power to load 184. Thus, a person would have to hold his finger on input terminal 188 for some period of time before he would see any resulting change in the illumination provided by light bulb 184. To prevent this from happening, the limit control 185 is provided. Thus, when the charge on capacitor 214 reaches the maximum effective limit, at which any further increase will no longer change the power delivered to the load 184, transistor 220 is turned on. This in turn turns on transistor 201. Threreby transistor 201 no longer acts as a diode, but conducts during both portions of the pulse at which circuit ground is positive with respect to earth ground so that there is no charge on capacitor 200. Thus there is no further pumping of current into capacitor 214 even though a person continues to hold his finger upon input terminal 198.

An important feature of both the FIG. 1 and FIG. 2 embodiments of the invention is that a charge on capacitor 214 is maintained even though the apparatus is disconnected from power supply 98. Of course, during the time that it is so connected to the power supply, the FET 216, in conjunction with resistor 218, acts as an operational amplifier to maintain the established charge on capacitor 214. However, with some memory devices, the charge on the memory capacitor would be rather rapidly dissipated by leakage once the powr supply 98 was removed or it could be varied by A.C. transients. With the disclosed embodiments, the only leakage paths from capacitor 214 are through neon bulbs 192 or 202 FET 216 (or the corresponding neon bulbs 23 and 25 and FET 41 of FIG. 1), but these present impedances which are well above tem million megohms. Thus, the power supply 98 can be removed from the apparatus for days without any significant change on memory capacitors 43 and 214. Thereby, when the power supply 98 is again connected to the apparatus, the load 184 will, for all practical purposes, be receiving the same power that it was before the power was disconnected.

Another important feature of the invention is the oscillating circuit grounds 31 and 196. Where prior art devices required specific oscillators, these are eliminated merely by the use of two resistors and two diodes (resistors 109, 133 and diodes 111, 137 of FIG. 1 and resistors 244, 249 and diodes 245, 250 of FIG. 2). By having this oscillation between circuit ground and earth ground, a number of important results are achieved, which results include: (1) a circuitry is simplified as just mentioned; (2) there is no necessity for having two touch plates which a person must touch simultaneously in order to complete a circuit between the oscillator and a respective sensor; and (3) no special orientation of the connection to power supply 98 is required.

This is illustrated with respect to FIG. 3, which is a diagrammatic representation of the embodiment schematically illustrated in FIG. 1. In FIG. 3 the resistance 290 represents the internal resistance of the various components which exist between the power supply connection 61 and circuit ground 31 (e.g. the resistance across voltage divider 71, 73, etc.). The firing angle control 291 represents the PUT 63, 65, capacitor 75, transformer 77, etc. The wire 292 represents the various connections shown in FIG. 1 leading to circuit ground 31. The wire 293 represents the various connections of FIG. 1 leading to power supply terminal 61. A wire 294 represents the electrical circuitry as connected to earth ground 9. The operational amplifier 295 is a representation of the FET 41 and its biasing resistors.

Assume that the voltage applied across internal resistance 290 is 12 volts. This voltage would be maintained by zener diode 145. Also assume that the power supply from alternator 98 was such that the potential on power line 102 oscillates between 112 volts positive and 112 volts negative with respect to earth ground 9, i.e. with respect to power line 104 and wire 294. Thus the voltage drop across resistors 109 and 133 would be 100 volts. When wire 102 is in its positive half cycle (the left half of FIG. 4A), diode 111 would, in effect, be a short circuit between wire 292 and wire 294. Thus wire 292 (i.e. circuit ground 31) would be at the same potential as wire 294 (i.e. earth ground 9). This is illustrated by the left half of FIG. 4B. Current would be flowing from terminal 99 through resistor 133, resistor 290 and diode 111 to terminal 101. The voltage drop across resistor 133 would be approximately 100 volts and the voltage drop across resistor 290 would be 12 volts.

Now assume that power line 102 moves into the negative half cycle with respect to earth ground, as illustrated in the right half of FIG. 4A. Diode 137 conducts, acting as a short circuit between wire 292 (circuit ground 31) and terminal 99. Thus circuit ground 31 has the same potential as terminal 99, that is, 112 volts negative with respect to earth ground. This is the negative pulse illustrated in the right half of FIG. 4B. There will be a current flow from terminal 101 through resistor 109, resistor 290 and diode 137 to terminal 99. There is a voltage drop in resistor 290 of 12 volts and a voltage drop in resistor 109 of about 100 volts. With repeated alternating current cycles at terminals 99 and 101 the voltage at circuit ground 31 oscillates with respect to earth ground 9, i.e. there are a succession of the negative half cycle pulses illustrated in FIG. 4B.

Now assume that a person's capacitance 8 is applied between earth ground, i.e. wire 294, and the decrease terminal 27. Actually, of course, a person need not actually contact earth ground or wire 294, but it has been added for purposes of illustration. During the first half of the negative pulse of FIG. 4B (the third quarter-cycle), circuit ground 31 is going negative with respect to earth ground 9 and, in the circuit comprising diode 19, capacitor 15, resistor 11 and capacitance 8, the diode 19 is blocking current flow. Thus a voltage builds up across the voltage sensitive switch 298. When the voltage reaches the magnitude at which the voltage sensitive high impedance switch 298 (corresponding to neon bulb 23) is actuated, the effect is to close a switch 299. This completes a series circuit between earth ground 294 and ground reference 292 as follows: capacitance 8, contact 27, resistor 11, capacitor 15, switch 299, memory capacitor 43 and operational amplifier 295. This results in memory capacitor 43 being discharged to the extent of the charge applied to capacitors 8 and 15. There is an attendant voltage drop on the voltage sensitive high impedance switch 298 which results in switch 299 again being opened. During the second half of the negative voltage pulse of FIG. 4B (i.e. the fourth quarter-cycle) circuit ground 31 is going positive with respect to earth ground 9. This changing potential is in the direction of easy conductivity of diode 19 so that a circuit between circuit ground 31 and earth ground 9 is established through the diode, capacitor 15, resistor 11 and capacitor 8. This will neutralize the charge which was applied to capacitor 15 during the previous quarter-cycle.

Applying capacitance 8 between wire 294 (i.e. earth ground) and increase terminal 29 has the same effect, except that during the first half of the negative pulse of FIG. 4B the diode 21 conducts and during the second half the diode 21 blocks resulting in a charge from capacitor 17 being added to the charge of capacitor 43.

Thus each sensor includes two circuits between earth ground 294 and circuit ground 31, each of which circuits includes capacitance 8, touch plates 27, 29, resistances 11, 13 and capacitors 15, 17, but one of the circuits being completed by the diodes 19, 21 and the second of the circuits being completed by the voltage sensitive high impedance switch (e.g. 298), the memory capacitor 43 and the operational amplifier 295. The sensors differ in the orientation of diodes 19 and 21 whereby the memory portion of the second of the circuits is short circuited for different portions of the circuit-ground-to-earth-ground voltage pulse; thus these diodes function as steering means for the current flow through the memory capacitor so that when one sensor is activated a current is pumped into that capacitor and when the other sensor is activated a current is pumped out of the memory capacitor.

Were a diagram similar to that of FIG. 3 to be made of the embodiment illustrated in FIG. 2, the circuitry would be the same except that the diodes would be reversed and wire 293 and positive terminal 61 would appear between the cathodes of the two diodes 111 and 137 of FIG. 3, and the gound wire 292 would be connected at the opposite end of internal resistance 190. Then the circuit ground to earth ground potential diagram (corresponding to FIG. 4B) would show a positive pulse coinciding in time with the positive A.C. pulse of FIG. 4A (but less in magnitude by the amount of the voltage drop across resistor 290) and a very small negative pulse (the amount of the voltage drop across resistor 290) coinciding in time with the negative pulse of the A.C. cycle of FIG. 4A. It would be the comparatively large positive pulse of circuit ground to earth ground that would be effective in changing the charge on memory capacitor 43, as previously described.

Inductances could employed imployed in place of resistances 109 and 133. As of the present state of the art, we prefer to use resistances because they are less expensive and are smaller in size. While there are important advantages in employing semi-conductors, it will be readily apparent to one skilled in the art that vacuum tubes could be used. The term valves is used herein to denote both semi-conductors and vacuum tubes. The term very high impedance used herein in connection with the voltage sensitive switches between the sensors and the memory is employed to mean that the impedance should be at least ten million megohms.

The input terminals 27, 29, 188, 198 need not necessarily be closely coupled to the respective resistances 11, 13, 189, 199, but can be placed at a remote location and connected to the resistances by a wire. However, such wire connaot be relatively long. With a long wire, there is sufficient capacitance between that wire and earth ground so that it has the same effect as when a person touches the input terminal, as previously described. Some increase in wire length can be achieved by the use of coaxial cable as compared to the length of just an ordinary wire that can be used when the shield of the coaxial cable is connected to circuit ground.

We claim:

1. An electronic power control including, in combination:
   a. A control circuit having:
      1. An A.C. power source including a pair of power lines one of which is connected to earth ground,
      2. A pair of load terminals,
      3. Means connecting one of said terminals to one of said power lines,
      4. First solid state switch means connected to one of said load terminals and connected to the other of said power lines,
      5. A voltage responsive trigger circuit means including a second solid state switch means and first capacitor means for supplying a firing angle control signal to said first solid state switch means,
      6. Semi-conductor buffer means connected to said second solid state switch means for controlling said second solid state switch means, and
      7. A memory circuit means including a semi-conductor means and second capacitor means operated as an integrator having an output with the output thereof being attached to said semi-conductor buffer means for providing a controlled analog voltage, the magnitude of which is determined by the charge on the second capacitor means, to said semi-conductor buffer means and thus to said trigger circuit means;
   b. An input circuit to said control circuit having a ground reference, said input circuit including a pair of current pump branch means, one of said branch means including,
      1. A first capacitor having an input side for contact by a person and an output side,
      2. A first diode having an anode and a cathode, said anode being connected to said output side of said first capacitor and said cathode being connected to said ground reference, and
      3. High impedance switch means connected between said control circuit and the connection of said output side of said first capacitor and said anode for allowing electrical flow in one direction only and prevent backflow when the input side of said first capacitor is not being contacted by a person;
   c. The other one of said branch means including:
      1. A second capacitor having an input side for contact by a person and an output side,
      2. A second diode having an anode and a cathode, said cathode of said second diode being connected to said output side of said second capacitor and said anode of said second diode being connected to said ground reference, and 3. High impedance switch means connected between said control circuit and the connection of said output side of said second capacitor and said second diode for allowing electrical flow in one direction only and prevent backflow when the input side of said second capacitor is not being contacted by a person; and d. A power supply for said control circuit having a voltage supply line comprising:

1. A voltage divider connected between said pair of power lines, the output of said voltage divider being connected to said voltage supply line, and 2. A pair of diodes connected back to back between said pair of power lines and the common point of the diodes being connected to said ground reference, whereby the ground reference oscillates with respect to earth ground and when a person contacts the input side of the capacitor of a branch means the capacitance of the person's body with respect to earth ground completes a series circuit which includes the power supply and the diode of the respective branch means so as to apply a voltage from said A.C. power source to that diode to cause it to conduct so that current is pumped into or out of the second capacitor means to thereby change the firing angle of said control signal, thus the power to a load can be controlled by a person contacting the input side of a said capacitor.

2. In a power control apparatus for operating a load from an A.C. power source comprising a pair of power lines one of which is at earth round, wherein the apparatus has a circuit ground and includes a solid state electronic switch to control the power from said source to said load, said switch having a control terminal at which a pulse will actuate the switch with the phase of the pulse determining the power received by the load, a firing angle converter device connected to said control terminal to establish the phase of said pulse, said device having an input at which an applied signal will determine the phase of said pulse, the improvement comprising:

memory means for storing a signal and having an input and output, said output being connected to said device input to apply said stored signal to said device input to establish said phase of said pulse, said stored signal being variable in response to signals at the memory means input with said signals at the memory means input being of a first character to change the stored signal in one sense and of a second character to change the stored signals in the opposite sense;

means connected to said A.C. power source for generating an oscillating signal between circuit ground and earth ground; and detector means having an output connected to said memory input, said detector means having two sensor devices, said detector means having a first signal steering means connected to circuit ground and also connected between one sensor device and the detector means output for producing signals of said first character at said detector means output when an impedance is applied between said one sensor device and earth ground so that said oscillating signal is thereby applied to said first signal steering means and a second signal steering means connected to circuit ground and also connected between the other sensor device and the detector means output for producing signals of said second character at said detector means output when an impedance is applied between said other sensor device and earth ground so that said oscillating signal is thereby applied to said second signal steering means, whereby by applying impedance between one or the other of said sensor devices and earth ground said firing angle will be changed in one direction or the other.

3. In a power control apparatus as set forth in claim 2 and intended to be operated by a person having a capacitance to earth ground, the improvement wherein:

each sensor device is a conductor of electricity;

each of said detector means including a capacitor and means connecting said capacitor to the respective sensor device and to the respective detector means output, each of said steering means including a diode and means connecting the diode to the respective detector means output and to circuit ground, in one detector means the diode having its direction of easy conductivity in the opposite sense from the direction of easy conductivity of the diode in the other circuit, whereby with said person touching the sensor device of one detector means the diode of said one detector means short circuits a first portion of said oscillating signal and a charge of one character builds up on the capacitor of said one detector means and with said person touching the sensor device of the other detector means the diode of said other detector means short circuits a second portion of the oscillating signal and a charge of another character builds up on the capacitor of said other detector means, said charges forming said signals at the memory means input.

4. In a power control apparatus as set forth in claim 3, including a very high impedance electronic switch means connected between the detector means output and the memory means, and resistance means connecting the memory means to circuit ground, said switch means being voltage sensitive and changing from switch open condition to switch closed condition by a voltage applied thereto during the portion of the oscillating signal when one of capacitors is charged whereby the charge of the one capacitor is applied to the memory means through the electronic switch means.

5. In a power control apparatus as set forth in claim 4, wherein said apparatus has two power input terminals adapted to be connected to said power lines to supply power to the apparatus;

wherein the firing angle converter device and the memory means include valve elements requiring D.C. power;

including two D.C. power conductors through which D.C. power is supplied to valve elements;

wherein said means for generating an oscillating signal includes two, at least approximately equal, impedances, means connecting said impedances in series between said power input terminals and including a central connection between the impedances, means connecting said central connection to one of said D.C. power conductors, two diodes, each diode having an element of first type and an element of a second type, the first element type being an anode and the second element type being a cathode, means connecting the diode elements of one type together and also connecting them to the other D.C. power conductor, means connecting the element of the other type of one of the two diodes to one power input terminal, and means connecting the element of the other type of the other of the two diodes to the second power input terminal;

a first of said D.C. power conductors being circuit ground and the second of the D.C. power conductors being at a D.C. potential different from circuit ground.

6. In a power control apparatus as set forth in claim 5, wherein
said first D.C. power conductor being the same as said one D.C. power conductor and said second D.C. power conductor being the same as said other D.C. power conductor.

7. In a power control apparatus as set forth in claim 5, wherein
said first D.C. power conductor being the same as said other D.C. power conductor and said second D.C. power conductor being the same as said one D.C. power conductor.

8. In a power control apparatus as set forth in claim 5, wherein said impedances are resistances.

9. In a power control apparatus as set forth in claim 5, wherein said memory means comprises:
amplifier means including a field effect transistor with three elements forming a junction, means connecting one of the transistor elements to the memory means input and means connecting the other two transistor elements to the D.C. power conductors respectively; and
capacitor means connected across said amplifier means and reverse biasing said junction when said D.C. power is not supplied to said D.C. power conductors;
whereby when power is not supplied to said transistor it has a very high impedance so that the charge on the memory means coapcitor means is not lost during the transition through zero crossing or upon removal of power.

10. In a power control apparatus as set forth in claim 9, wherein said very high impedance electronic switch means is a neon bulb.

11. In an apparatus as set forth in claim 4, wherein said memory means requires D.C. power and comprises:
amplifier means including a field effect transistor having a junction; and
means including capacitor means connected across said amplifier means and reverse biasing said junction when said D.C. power is not supplied to said memory means;
whereby when power is not supplied to said transistor it has a very high impedance so that the charge on the memory means capacitor means is not lost therethrough during the transition through zero crossing or upon removal of power.

12. In a power control apparatus as set for in claim 11, including means connected to said memory means to limit the maximum change of said capacitor of said memory means.

13. In a power control apparatus as set forth in claim 2,
wherein the detector means includes very high impedance electronic switch means forming the output thereof; and wherein said memory means requires D.C. power and comprises:
amplifier means including a field effect transistor having a junction; and
means including capacitor means connected across said amplifier means and reverse biasing said junction when said D.C. power is not supplied to said memory means;
whereby the charge on the memory means capacitor means is not lost during the transition through zero crossing or upon removal of power.

14. In a power control apparatus as set forth in claim 13, wherein said high impedance electronic switch means is a neon bulb.

15. In an apparatus as set forth in claim 14, including means connected to said memory means limit the maximum charge of said capacitor of said memory means.

16. In a power control apparatus as set forth in claims 15 and intended to be operated by a person having a capacitance to earth ground, the improvements wherein:
each sensor device is a conductor of electricity;
each of said detector means including a capacitor and means connecting said capacitor to the respective sensor device and to the respective detector means output, each of said steering means including a diode and means connecting the diode to the respective detector means output and to circuit ground, in one detector means the diode having its direction of easy conductivity in the opposite sense from the direction of easy conductivity of the diode in the other circuit, whereby in one detector means the diode short circuits a first portion of said oscillating signal and in the other detector means the diode short circuits a second portion of the oscillating signal; and
said limiting means comprises a transistor which is connected to serve as the diode in the circuit having the polarity such as to increase the charge on the memory capacity, and means connecting the limiting means transistor to the memory means for turning on said transistor when said memory means capacitor reaches its desired maximum charge.

17. In a proximity control apparatus for use with an A.C. power source comprising a pair of power lines one of which is at earth ground and a device to be controlled by said apparatus and having an input, wherein the apparatus has a circuit ground, the improvement comprising:
memory means for storing a signal and having an input and output, said output being connected to said device input to apply said stored signal to said device input, said stored signal being variable in response to signals at the memory means input with said singals at the memory means input being of a first character to change the stored signal in one sense and of a second character to change the stored signals in the opposite sense;
means connected to said A.C. power source for generating an oscillating signal between circuit ground and earth ground; and
detector means having an output connected to said memory input, said detector means having two sensor devices, said detector means having a first signal steering means connected to circuit ground and also connected between one sensor device and the detector means output for producing signals of said first character at said detector means output when an impedance is applied between said one sensor device and earth ground so that said oscillating signal is thereby applied to said first signal steering means and a second signal steering means connected to circuit ground and also connected between the other sensor device and the detector means output for producing signals of said second character at said detector means output when an impedance is applied between said other sensor device and earth ground so that said oscillating signal is thereby applied to said second signal steering means, whereby by applying impedance between one or the other of said sensor devices and earth ground said signal stored in the memory means will be changed.

18. In a proximity control apparatus as set forth in claim 17 and intended to be operated by a person having a capacitance to earth ground, the improvement wherein;

each sensor device is a conductor of electricity,
each of said detector means including a capacitor and means connecting said capacitor to the respective sensor device and to the respective detector means output, each of said steering means including a diode and means connecting the diode to the respective detector means output and to circuit ground, in one detector means the diode having its direction of easy conductivity in the opposite sense from the direction of easy conductivity of the diode in the other circuit, whereby with said person touching the sensor device of one detector means the diode of said one detector means short circuits a first portion of said oscillating signal and a charge of one character builds up on the capacitor of said one detector means and with said person touching the sensor device of the other detector means the diode of said other detector means short circuits a second portion of the oscillating signal and a charge of another character builds up on the capacitor of said other detector means, said charges forming said signals at the memory means input.

19. In a proximity control as set forth in claim 18, wherein said means connecting said detector means capacitor to said sensor device includes a resistance.

20. In a proximity control apparatus as set forth in claim 18, including a very high impedance electronic switch means connected between the memory input and the output of the detector means, and resistance means connecting the memory means to circuit ground, said switch means being voltage sensitive and changing from switch open condition to switch closed condition by a voltage applied thereto during the portion of the oscillating signal when one of cpaacitors is charged whereby the charge of the one capacitor is applied to the memory means through the electronic switch means.

21. In a proximity control apparatus as set forth in claim 20,
wherein said apparatus has two power input terminals adapted to be connected to said power lines to supply power to the apparatus;
wherein the firing angle converter device and the memory means include valve elements requiring D.C. power;
including two D.C. power conductors through which D.C. power is supplied to valve elements;
wherein said means for generating an oscillating signal includes two, at least approximately equal, impedances, means connecting said impedances in series between said power input terminals and including a central connection between the impedances, means connecting said central connection to one of said D.C. power conductors, two diodes, each diode having an element of a first type and an element of a second type, the first element type being an anode and the second element type being a cathode, means connecting the diode elements of one type together and also connecting them to the other D.C. power conductor, means connecting the element of the other type of one of the two diodes to one power input terminal, and means connecting the element of the other type of the other of the two diodes to the second power input terminal;
a first of said D.C. power conductors being circuit ground and the second of the D.C. power conductors being at a D.C. potential different from circuit ground.

22. In a proximity control apparatus as set forth in claim 21, wherein
said first D.C. power conductor being the same as said one D.C. power conductor and said second D.C. power conductor being the same as said other D.c. power conductor.

23. In a proximity control apparatus as set forth in claim 22, wherein said impedances are resistances.

24. In a proximity control apparatus as set forth in in claim 21, wherein
said first D.C. power conductor being the same as said other D.C. power conductor and said second D.C. power conductor being the same as said one D.C. power conductor.

25. In a proximity control apparatus as set forth in claim 21, wherein said memory means comprises:
amplifier means including a field effect transistor with three elements forming a junction, means connecting one of the trnasistor elements to the memory means input and means connecting the other two transistor elements to the D.C. power conductors respectively; and
capacitor means connected across said amplifier means and reverse biasing said junction when said D.C. power is not supplied to said D.C. power conductors;
whereby when power is not supplied to said transistor it has a very high impedance so that the charge on the memory means capacitor means is not lost during the transition through zero crossing or upon removal of power.

26. In a proximity control apparatus as set forth in claim 25, wherein said very high impedance electronic switch means is a neon bulb.

27. In a proximity control apparatus as set forth in claim 20, wherein said memory means requires D.C. power and comprises:
amplifier means including a field effect transistor having a junction; and
means including capacitor means connected across said amplifier means and reverse biasing said junction when said D.C. power is not supplied to said memory means;
whereby when power is not supplied to said transistor it has a very high impedance so that the charge on the memory means capacitor means is not lost therethrough during the transition through zero crossing or upon removal of power.

28. In a proximity control apparatus as set forth in claim 27, including means connected to said memory means to limit the maximum charge of said capacitor of said memory means.

29. In a proximity control apparatus as set forth in claim 17,
wherein the detector means includes very high impedance electronic switch means forming the output thereof, and
wherein said memory means requires D.C. power and comprises:
amplifier means including a field effect transistor having a junction; and
means including capacitor means connected across said amplifier means and reverse biasing said junction when said D.C. power is not supplied to said memory means;
whereby the charge on the memory means capacitor means is not lost during teh transition through zero crossing or upon removal of power.

30. In a proximity control apparatus as set forth in claim 29, wherein said high impedance electronic switch means is a neon bulb.

31. In a proximity control apparatus as set forth in claim 29, including means connected to said memory means to limit the maximum charge of said capacitor of said memory means.

32. In a proximity control apparatus as set forth in claim 31 and intended to be operated by a person having a capacitance to earth ground, the improvement wherein:
each sensor device is a conductor of electricity;
each of said detector means including a capacitor and means connecting said capacitor to the respective sensor device and to the respective detector means output, each of said steering means including a diode and means connecting the diode to the respective detector means output and to circuit ground, in one detector means the diode having its direction of easy conductivity in the opposite sense from the direction of easy conductivity of the diode in the other circuit, whereby in one detector means the diode short circuits a first portion of said oscillating signal and in the other detector means the diode short circuits a second portion of the oscillating signal; and
said limiting means comprises a transistor which is connected to serve as the diode in the circuit having the polarity such as to increase the charge on the memory capacity, and means connecting the limiting means transistor to the memory means for turning on said transistor when said memory means capacitor reaches its desired maximum charge.

33. In a proximity control apparatus to detect the presence of an object having an impedance to earth ground and for use with an A.C. power source comprising a pair of power lines one of which is at earth ground, wherein the apparatus has a circuit ground, two A.C. power input terminals adapted to be connected to said power lines to supply power to the apparatus, two D.C. power conductors through which D.C. power is supplied, and resistance means connected between said conductors, the improvement comprising:
means for generating an oscillating signal between circuit ground and earth ground and comprising two, at least approximately equal, impedances, means connecting said impedances in series between said power input terminals and including a central connection between the impedances, means connecting said central connection to one of said D.C. power conductors, two diodes, each diode having an element of a first type and an element of a second type, the first element type being an anode and the second element type being a cathode, means connecting the diode elements of one type together and also connecting them to the other D.C. power conductor, means connecting the element of the other type of one of the two diodes to one power input terminal, and means connecting the element of the other type of the other of the two diodes to the second power input terminal, a first of said D.C. power conductors being circuit ground and the second of the D.C. power conductors being at a D.C. potential different from circuit ground, whereby the oscillation between earth ground and circuit ground will be achieved irrespective of the orientation of said input terminals with respect to said power lines; and
detector means including an electrically conductive sensor device to which said impedance to earth ground can be connected, and current pump means connected to said sensor device and to circuit ground;
whereby when said impedance to earth ground is connected to said sensor device said oscillating signal is applied to said current pump means.

34. In a proximity control apparatus as set forth in claim 33, wherein said detector means comprises a series circuit which includes said object, said sensor device, circuit ground, earth ground, a capacitance and a diode in series.

35. In a proximity control apparatus as set forth in claim 34 wherein said series circuit includes a resistance.

36. In a proximity control apparatus as set forth in claim 33, wherein
said first D.C. power conductor being the same as said one D.C. power conductor and said second D.C power conductor being the same as said other D.C. power conductor.

37. In a proximity control apparatus as set forth in claim 33, wherein
said first D.C. power conductor being the same as said other D.C. power conductor and said second D.C. power conductor being the same as said one D.C. power conductor.

38. In a proximity control apparatus as set forth in claim 33, wherein said impedances are resistances.

39. In a proximity control apparatus to detect the presence of an object having an impedance to earth ground and for use with an A.C. power source comprising a pair of power lines one of which is at earth ground, wherein the apparatus as a circuit ground, two A.C. power input terminals adapted to be connected to said power lines to supply power to the apparatus, the improvement comprising:
means for generating an oscillating signal between circuit ground and earth ground;
detector means including an electrically conductive sensor device, a capacitor, a diode, and a series circuit which includes said object, circuit ground, earth ground, said diode, said capacitor and said sensor device in series, whereby with said impedance applied to said sensor device, said diode short circuits a first portion of said oscillating signal and a charge builds up on said capacitor; and means for utilizing said charge on said capacitor and forming a series circuit which includes said object, said capacitor, circuit ground and earth ground.

40. In a proximity control apparatus as set forth in claim 39 wherein said series circuit includes a resistance.

41. The combination of a control circuit utilizing an oscillating signal and a power supply apparatus for said control circuit and for use with an A.C. power source comprising a pair of power lines one of which is at earth ground, said apparatus having a circuit ground, two A.C. power input terminals adapted to be connected to said power lines to supply power to the apparatus, two D.C. power conductors through which D.C. power is supplied, and resistance means connected between said conductors, said apparatus comprising means for generating an oscillating signal between circuit ground and earth ground and comprising:

two, at least approximately equal, impedances, means connecting said impedances in series between said power input terminals and including a central connection between the impedances, means connecting said central connection to one of said D.C. power conductors, two diodes, each diode having an element of a first type and an element of a second type, the first element type being an anode and the second element type being a cathode, means connecting the diode elements of one type together and also connecting them to the other D.C. power conductor, means connecting the element of the other type of one of the two diodes to one power input terminal, and means connecting the element of the other type of the other of the two diodes to the second power input terminal;

a first of said D.C. power conductors being circuit ground and the second of the D.C. power conductors being at a D.C. potential different from circuit ground;

said control circuit being connected between said earth ground and said circuit ground to utilize said oscillating signal therebetween as its oscillating signal.

42. The combination as set forth in claim 41, wherein said first D.C. power conductor being the same as said one D.C. power conductor and said second D.C. power conductor being the same as said other D.C. power conductor.

43. The combination as set forth in claim 41, wherein said first D.C. power conductor being the same as said other D.C. power conductor and said second D.C. power conductor being the same as said one D.C. power conductor.

44. The combination as set forth in claim 41, wherein said impedances are resistances.

45. The method of detecting the presence of an object having an impedance to earth ground utilizing a detector sensitive to the presence of an oscillating signal when coupled to the detector through a sensor forming a part of the detector, a device to be connected to a pair of A.C. power lines, one of which is connected to earth ground, and which produces D.C. power therefrom at two connections, a first of which has a potential which oscillates with respect to earth ground irrespective of the orientation of the connection between the device and the A.C. power lines and the second of which is at a D.C. potential different from that of the first connection, including the steps of:

coupling said first connection to said detector and utilizing said oscillating signal between circuit ground and earth ground as the oscillating signal for the operation of said detector when said object is connected to said sensor.

46. The method of detecting the presence of an object having an impedance to earth ground utilizing a device to be connected to a pair of A.C. power lines, one of which is connected to earth ground, and which produces D.C. power therefrom at two connections, a first of which has a potential which oscillates with respect to earth ground and the second of which is at a D.C. potential different from that of the first connection, including the steps of:

a. establishing a first series circuit which includes earth ground, said object, a capacitance, and said first connection;

b. establish a second series circuit which includes earth ground, said object, said capacitance, an open switch and said first connection;

c. limiting the current flow in said first series circuit to only one-half of the A.C. cycle and thereby building up said charge in said capacitor during only said half of the A.C. cycle;

d. determining when the voltage across said switch reaches a predetermined magnitude and thereupon closing said switch, whereupon said capacitor discharges through said second series circuit;

e. determining the sense of the current in said second series circuit resulting from said discharge of the capacitor; and f. thereafter opening said switch for the repetition of steps (c), (d) and (e) so long as said object is present in said series circuits.

\* \* \* \* \*

UNITED STATES PATENT AND TRADEMARK OFFICE
CERTIFICATE OF CORRECTION

PATENT NO. : 3,984,757
DATED : October 5, 1976
INVENTOR(S) : Daniel A. Gott; J. Marshall Dudley It is certified that error appears in the above-identified patent and that said Letters Patent are hereby corrected as shown below:

Column 1, line 59, "oscillator" should read --"oscillator"--. Column 3, line 50, "ground reference" should read --"ground reference"--. Column 4, line 55, "on" should read --"on"--. Column 5, line 55, "doides" should read --diodes--. Column 6, line 63, "casues" should read --causes--. Column 7, line 7, "magentic" should read --magnetic--. Column 7, line 11, "transofrmer" should read --transformer--. Column 7, line 68, "resistors" should read --resistor--. Column 8, line 40, "connecteds" should read --connected--. Column 8, line 41, "traic" should read --triac--. Column 9, line 14, --, 240 K ohms-- should be inserted after "ohms". Column 9, line 43, "of" should read --on--. Column 10, line 4, "contanct" should read --contact--. Column 10, line 32, "move" should read --more--. Column 10, line 53, "enon" should read --neon--. Column 11, line 41, "powr" should read --power--. Column 11, line 45, --and-- should be inserted after "202". Column 11, line 47, "tem" should read --ten--. Column 13, line 59, --be-- should be inserted after "could". Column 14, line 7, "cannaot" should read --cannot--. Column 15, line 32, "round" should read --ground--. Column 17, line 39, "coapcitor" should read --capacitor--. Column 18, line 16, --to-- should be inserted before "limit". Column 18, line 18, "claims" should read --claim--. Column 18, line 55, "singals" should read --signals--. Column 19, line 53, "cpaacitors" should read --capacitors--. Column 20, line 25, "D.c." should read --D.C.--. Column 20, line 28, "in" second occurrence should be deleted. Column 20, line 39, "trnasistor" should read --transistor--. Column 21, line 19, "teh" should read --the--. Column 22, line 14, "a first" should start a subparagraph. Column 22, line 18, "whereby" should start a subparagraph. Column 22, line 57,

UNITED STATES PATENT AND TRADEMARK OFFICE
CERTIFICATE OF CORRECTION

PATENT NO. : 3,984,757
DATED : October 5, 1976
INVENTOR(S) : Daniel A. Gott; J. Marshall Dudley It is certified that error appears in the above-identified patent and that said Letters Patent are hereby corrected as shown below:

"as" should read --has--. Column 23, line 21, "two" should start a subparagraph. Column 23, line 37, "a first" should start a subparagraph.

Signed and Sealed this

Fourth Day of January 1977

[SEAL]

Attest:

RUTH C. MASON
Attesting Officer

C. MARSHALL DANN
Commissioner of Patents and Trademarks